US00RE34499E

United States Patent [19]

Wu et al.

[11] E Patent Number: Re. 34,499

[45] Reissued Date of Patent: Jan. 4, 1994

[54] FREQUENCY MODULATED RADIO FREQUENCY BROADCAST NETWORK EMPLOYING A SYNCHRONOUS FREQUENCY MODULATED BOOSTER SYSTEM

[75] Inventors: Joseph C. Wu, Saratoga; Charlie L. Hu, San Jose; Yee S. Law, Milpitas, all of Calif.

[73] Assignee: TFT, Inc., Santa Clara, Calif.

[21] Appl. No.: 860,690

[22] Filed: Mar. 30, 1992

Related U.S. Patent Documents

Reissue of:

[64] Patent No.: 5,046,124
Issued: Sep. 3, 1991
Appl. No.: 326,744
Filed: Mar. 21, 1989

[51] Int. Cl.[5] ..... H04B 7/15

[52] U.S. Cl. ..... 455/20; 455/23; 455/51.1; 455/75; 455/260; 455/265

[58] Field of Search ..... 455/13.1, 14, 16, 20, 455/22, 23, 51.1, 51.2, 69-71, 75, 208, 259, 260, 265; 375/81

[56] References Cited

U.S. PATENT DOCUMENTS

| | | | |
|---|---|---|---|
| 2,284,415 | 5/1942 | Goldstine | 250/15 |
| 2,545,197 | 3/1951 | Darling | 250/6 |
| 3,902,019 | 7/1975 | Bruene | 179/15 BT |
| 3,927,373 | 12/1975 | Janssens | 325/58 |
| 4,117,405 | 9/1978 | Martinez | 325/58 |
| 4,188,582 | 2/1980 | Cannalte et al. | 325/58 |
| 4,208,630 | 6/1980 | Martinez | 375/7 |
| 4,317,220 | 2/1982 | Martin | 455/51.2 X |
| 4,322,842 | 3/1982 | Martinez | 370/11 |
| 4,395,776 | 7/1983 | Naito et al. | 455/119 |
| 4,451,930 | 5/1984 | Chapman et al. | 455/260 |
| 4,506,383 | 3/1985 | McGann | 455/17 |
| 4,513,415 | 7/1985 | Martinez | 370/92 |
| 4,608,699 | 8/1986 | Batlivala et al. | 375/5 |
| 4,626,914 | 12/1986 | Breimer | 358/148 |
| 4,696,052 | 9/1987 | Breeden | 455/51.1 |
| 4,709,401 | 11/1987 | Akerberg | 455/51.1 |
| 4,710,970 | 12/1987 | Wu et al. | 455/113 |
| 4,837,853 | 4/1989 | Heck | 455/208 |

FOREIGN PATENT DOCUMENTS

| | | |
|---|---|---|
| 0127918 | 5/1984 | European Pat. Off. . |
| 2061518B | 5/1983 | United Kingdom . |

OTHER PUBLICATIONS

Advertising Literature published by Continental Electronics Mft. Co., entitled "Continental Type 802A FM Exciter," 1984.

Article published by Omega International entitled "Synchronous Repeaters".

Advertising Literature published by Television Technology Corporation entitled "Solid State FM Transmitter FM-300J".

Patent Abstract of Japan, vol. 7, No. 36, (E-158) [1181] Feb. 8, 1983; JP-A-57 190 143 (Matsushita) Nov. 24, 1982.

Advertising Literature published by Broadcast Electronics, Inc. entitled "FX-30 Synthesized FM Exciter".

*Primary Examiner*—James L. Dwyer
*Assistant Examiner*—Chi H. Pham
*Attorney, Agent, or Firm*—Jack M. Wiseman

[57] ABSTRACT

A frequency modulated radio frequency broadcast network in which re-transmitting stations employ a synchronous frequency modulated booster system. Included in the frequency modulated booster system is a synchronous frequency [modualted] *modulated* exciter for converting a frequency modulated intermediate frequency into a frequency modulated broadcast signal. The synchronous frequency modulated [exicter] *exciter* includes phase locked loop circuits for synchronizing the re-transmitted frequency modulated broadcast signal with the frequency modulated intermediate frequency signal by detecting reference signals in the composite baseband of the intermediate frequency signal and in the composite signal frequency modulated broadcast signal.

30 Claims, 6 Drawing Sheets

FREQUENCY MODULATED RADIO FREQUENCY BROADCAST NETWORK EMPLOYING A SYNCHRONOUS FREQUENCY MODULATED BOOSTER SYSTEM

Matter enclosed in heavy brackets [ ] appears in the original patent but forms no part of this reissue specification; matter printed in italics indicates the additions made by reissue.

BACKGROUND OF THE INVENTION

The present invention relates in general to a frequency modulated radio frequency synchronous repeater system for the transmission of frequency modulated broadcast signals, and more particularly to a frequency modulated radio frequency repeater system employing a synchronous frequency modulated booster system for the re-transmission of frequency modulated broadcast signals.

Frequency modulated broadcast transmissions have been limited to audiences within a reception area. In order to increase the reception area for the frequency modulated broadcast transmission to reach a greater audience, re-transmission sites have been installed in areas remotely located from the originating transmitter. At the re-transmission sites were booster transmitters and synchronous transmitter exciters to increase the power level of the frequency modulated broadcast signals at a re-transmission site.

Heretofore, a demodulation process was used at a re-transmission site which caused phase shifts, delays and inconsistent modulation levels between the originating frequency modulated broadcast signal and the frequency modulated broadcast signal at the re-transmission site. Phase shifts, delays and inconsistent modulation levels between the originating frequency modulated radio frequency signal and the re-transmitted frequency modulated radio frequency signal resulted in signal degradation and noise interference in the coverage area intended for improvement by the re-transmitted frequency modulated broadcast signal of the booster transmitter.

Heretofore, a device was employed to produce a reference signal for synchronizing and stabilizing the output of frequency modulated radio frequency signals transmitted at a re-transmission booster site. The device did not use a reference signal generated at the site of the originating transmitter or re-use the FM modulation in the original carrier. Hence, the output of the frequency modulated radio frequency signal of the transmitter at the re-transmission booster site was modified from the original FM signal in frequency and in phase.

In the U.S. Pat. to Wu et al., No. 4,710,970, issued on Dec. 1, 1987, for Method Of And Apparatus For Generating A Frequency Modulated Ultrahigh Frequency Radio Transmission Signal, there is disclosed an ultra high radio frequency transmitter. The output of a very high frequency voltage controlled generator is phase locked through a phase detector with a voltage controlled crystal oscillator producing a reference signal for the stabilizing of the output transmission frequency of the ultra high radio frequency transmission frequency oscillator.

In the U.S. Pat. to Martinez, No. 4,208,630, issued on June 17, 1980, for Narrow Band Paging Or Control Radio System, there is disclosed a radio system for paging in which a central transmitting device and remote receiving devices are phase locked to a local broadcast station radio frequency carrier so as to provide a means to synchronize the transmitting device with the receiving device.

The British Patent to McGraw-Edison Company, No. 2,061,581B, published on May 18, 1983, for Communication System For Distribution Automation And Remote Metering, discloses a phase detector to which is applied the output of a limiter-amplifier and a reference signal from a voltage controlled crystal oscillator. The output of the phase detector is a control signal which is proportional to the phase differences of the input signals to the phase detector. The error signal is applied to the voltage controlled crystal oscillator. The circuit described is part of a phase locked loop circuit.

In an article published by Omega International of Irvine, Calif., entitled Synchronous Repeaters, there is mentioned that the output frequency of a booster is phase locked with the originating station through analog simulation of a digital control signal derived from the originating station.

Heretofore, FM exciters were sold to accept the composite baseband signal from a stero generator, and STL system or monaural audio and SCA programming, and to generate its operating frequency with a digitally programmed, phase-locked frequency synthesis system. Such an FM exciter was sold by Continental Electronics Mfg. Co. of Dallas, Tex., as the Continental Type 802A FM exciter, and by Broadcast Electronics of Quincy, Ill., as the Model FX-30.

SUMMARY OF THE INVENTION

A synchronous frequency modulated booster system for a transmitter that re-transmits frequency modulated radio frequency signals at a booster site away from the originating program source. The synchronous frequency modulated booster system includes a synchronous FM transmitter exciter that converts incoming frequency modulated intermediate frequency signals transmitted at the site of an originating transmitter to the frequency modulated radio frequency signals transmitted by the originating transmitter and applies the frequency converted frequency modulated radio frequency modulated radio frequency signals to a booster transmitter that re-transmits the frequency modulated radio frequency signals.

A synchronous frequency modulated booster system comprises a transmitter that re-transmits frequency modulated radio frequency signals. The synchronous frequency modulated booster system includes a synchronous FM exciter that receives an IF signal and a reference pilot signal generated at the originating transmitter for synchronizing the carrier frequency and modulation level of frequency modulated radio frequency signals applied to the transmitter for re-transmission with the frequency modulated radio frequency signals transmitted at the originating transmitter.

An object of the present invention is to provide a method of synchronizing frequency modulated booster system for a transmitter that re-transmits frequency modulated radio frequency signals, which booster system includes a synchronous FM exciter for stabilizing the frequency of the booster transmitter, the baseband, group delays, and inconsistent modulation levels between frequency modulated radio frequency signals transmitted by an originating transmitter and the frequency modulated radio frequency signals re-transmitted from a remote transmitter.

Another object of the present invention is to provide a synchronous frequency modulated booster system for a transmitter that re-transmits frequency modulated radio frequency signals which booster system includes a synchronous FM exciter for receiving a reference signal from the site of the originating transmitter along with frequency modulated intermediate frequency signals for synchronizing the re-transmitted frequency modulated radio frequency signals with the frequency modulated radio frequency signals transmitted by the originating transmitter to preserve signal integrity and stability.

Another object of the present invention is to provide an economical arrangement for intermediate frequency repeating transmitter links.

A feature of the present invention is to obviate need for an additional subcarrier frequency which has been heretofore used for transmitting a synchronizing tone to lock the carrier frequency of the FM transmitter.

Another feature of the present invention is that the modulation levels at all remote transmitters are synchronized.

Another feature of the present invention is the minimization of audio phase delays for enhancing stereo quality.

Another feature of the present invention is the elimination of an FM subcarrier to transmit a reference signal for synchronizing the frequency of the booster transmitter.

Another feature of the present invention is that a synchronous FM exciter can be employed to modify the modulation level of incoming modulation depth of the FM carrier by a constant, for example:

1.5 (input = ±55 KHz; output = ±82.5 KHz).

DESCRIPTION OF THE PREFERRED EMBODIMENTS

Figure 1:
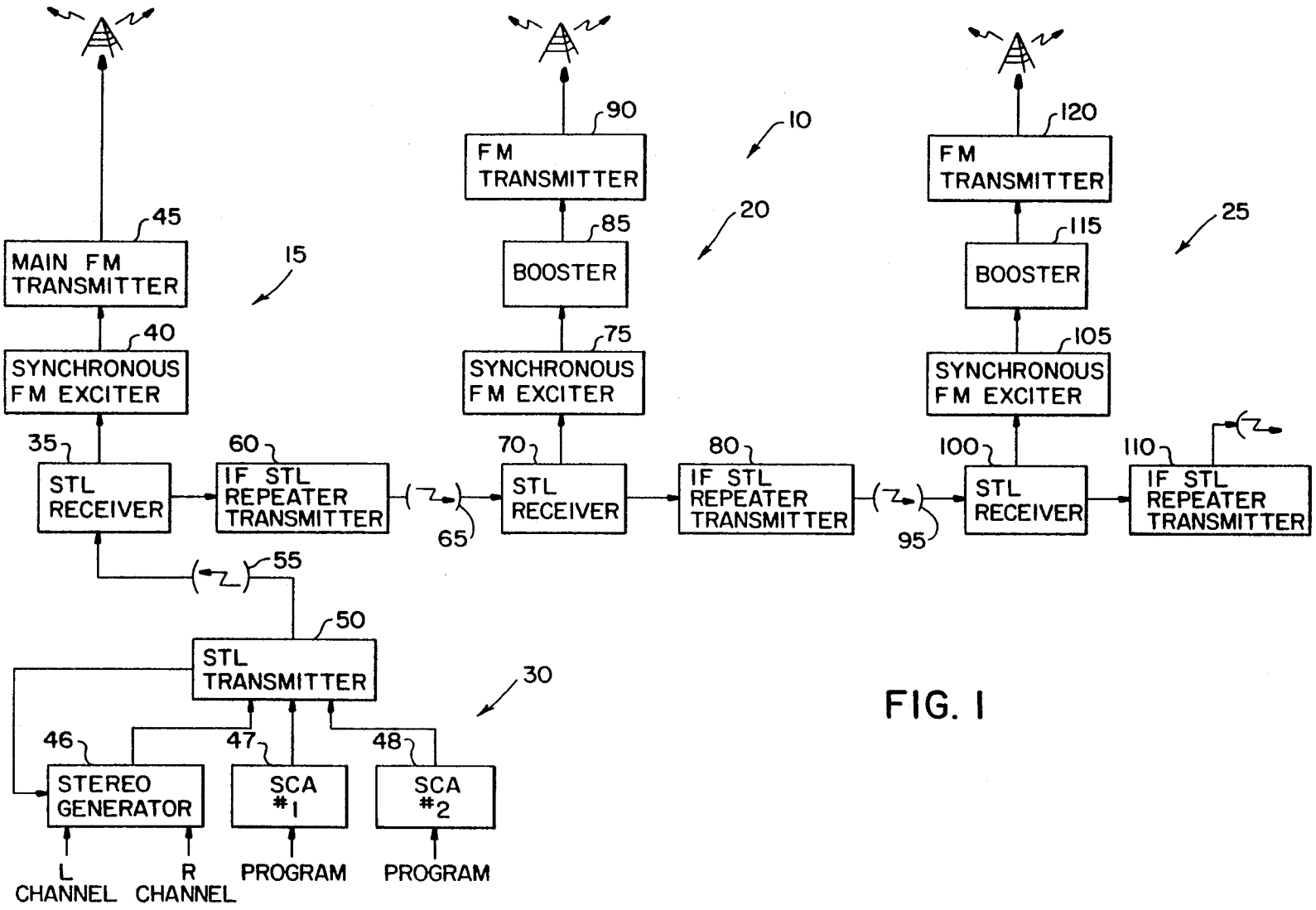
FIG. 1 is a block diagram of a transmitter system for originating frequency modulated radio frequency signals and transmitter systems for re-transmitting frequency modulated radio frequency signals.

Illustrated in FIG. 1 is a serial feed frequency modulated radio frequency broadcast system or network 10 with boosters, which comprises an originating broadcast station 15 for broadcasting an originating frequency modulated radio frequency signal (FM) and re-transmitting broadcast stations 20 and 25 for re-transmitting, respectively, the frequency modulated radio frequency signals (FM) transmitted by the originating broadcast station 15. The re-transmitting broadcast stations 20 and 25 are on-site remotely located from the site of the originating broadcast station 15.

The originating FM broadcast station 15 comprises a suitable studio 30, a conventional studio transmitter link (STL) receiver 35 with an intermediate frequency output, a synchronous FM exciter 40, and a conventional originating FM transmitter 45. Included in the studio 30 are an FM broadcast stereo generator 46, and conventional FM subcarrier generators for subsidiary communication authorization (SCA) equipment 47 and 48, all of which are connected to a conventional studio link (STL) transmitter 50 for transmitting a composite FM baseband signal from the studio to the originating broadcast station 15.

The FM broadcast stereo generator 46 is modified to accept a highly stable time base reference signal. This signal is 19 KHz or multiple of 19 KHz generated by a highly stable crystal oscillator, not shown, with a long term stability of 1 ppm per year. The highly stable crystal oscillator is included in the STL transmitter 50. In this manner, a highly stable time base reference signal is provided for phase locking the originating broadcast frequency and the rebroadcasting frequencies in the entire network 10 so that stability and accuracy of the broadcast frequencies are achieved.

The output of the STL transmitter 50 is an FM signal which, in the exemplary embodiment, is a 950 megahertz (MHz) signal. The stereo generator 46 and the SCA equipment 47 and 48 modulate the carrier frequency generated by the STL transmitter 50 with the program to be broadcast to provide the FM signal of 950 MHz. The STL transmitter 50 applies a reference signal to the stereo generator 46. In the exemplary embodiment, the reference signal is a 19 kilohertz (KHz) signal or a multiple of a 19 KHz frequency signal.

The STL receiver 35 receives through a suitable studio link 55, the FM signal from the STL transmitter 50, and applies an FM signal to the synchronous FM exciter 40 and an FM signal to a conventional intermediate frequency (IF) STL transmitter or a one-way repeater 60. In the exemplary embodiment, the FM signal applied to the synchronous FM exciter 40 from the STL receiver 35 is a 10.7 MHz signal and the FM signal applied to the IF repeater STL transmitter 60 is a 63 MHz signal, which is also the IF signal of the STL receiver 35. The studio link 55, in the exemplary embodiment, may be a conventional microwave link, telephone lines, or the like. The reference signal from the stereo generator 46 to the STL transmitter 50 is received by the STL receiver 35 with the 950 MHz signal and is present in both the 10.7 MHz signal applied to the synchronous FM exciter 40 and the 63 MHz signal applied to the IF STL transmitter 60.

The synchronous FM exciter 40, which will be described in detail hereinafter, applies to the originating FM transmitter 45, an FM broadcast signal, the carrier frequency of which is generated by the synchronous FM exciter 40. In the exemplary embodiment, the FM transmitter 45 transmits an FM broadcast signal in the range of 88 MHz–108 MHz.

A conventional link 65, such as a microwave link, VHF or UHF link, inter-city relay and the like is employed for transmitting an FM IF signal to an STL receiver 70 of the re-transmitting FM broadcast booster station 20. In the exemplary embodiment, the FM IF signal transmitted by the IF STL transmitter 60 is an FM 950 MHz signal. The IF STL transmitter 60 increases the carrier frequency from 63 MHz to 950 MHz, in the exemplary embodiment.

The STL receiver 70 applies an FM signal to a synchronous FM exciter 75 of the re-transmitting station 20 and an FM signal to an IF repeater STL transmitter or one-way repeater 80 of the re-transmitting station 20. The signal applied to the synchronous FM exciter 75, in the exemplary embodiment, is 10.7 MHz FM signal with a 19 KHz reference signal in the composite baseband signals. The signal applied to the IF repeater STL transmitter 80, in the preferred embodiment, is 63 MHz FM signal with a 19 KHz reference signal in the composite baseband signals which is also the IF signal of the STL receiver 70. The synchronous FM exciter 75, which will be described in detail hereinafter, is similar in construction and operation to the synchronous FM exciter 40 of the originating transmission station 15. In the exemplary embodiment, the output of the synchronous FM exciter 75 is an FM signal having a frequency in the range of 88 MHz–108 MHz.

Connected to the output of the synchronous FM exciter 75 is a suitable booster 85 of the re-transmission station 20, which, in a conventional manner, amplifies the power of the FM signal applied to a re-transmitting or repeater transmitter 90 of the re-transmitting station 20. Thus, the output of the FM signal from the synchronous FM exciter 75 has the power level thereof amplified by the booster 85 to compensate for losses that may occur from the transmission of signals from the broadcast station 15 to the broadcast station 20 and increase the signal strength of the originating transmitter 15 without causing transmission interference with other booster stations of the network 10. The output signal of the re-transmitter 90, in the preferred embodiment, is in the range of 88 MHz–108 MHz.

A conventional link 95, such as a microwave link, VHF or UHF link, inter-city relay and the like is employed for transmitting an FM IF signal to an STL receiver 100 of the re-transmitting FM broadcast booster station 25. In the exemplary embodiment, the FM IF signal transmitted by the IF repeater STL transmitter 80 is an FM 950 MHz signal. The IF repeater STL transmitter increases the carrier frequency from 63 MHz to 960 MHz in the exemplary embodiment.

The STL receiver 100 applies an FM signal to a synchronous FM exciter 105 of the re-transmitting station 25 and an FM signal to an IF repeater STL transmitter or one-way repeater 110 of a succeeding station. The signal applied to the synchronous FM exciter 105, in the exemplary embodiment, is a 10.7 MHz FM signal with a 19 KHz reference signal in the composite baseband frequencies. The signal applied to the IF repeater STL transmitter 110, in the preferred embodiment, is a 63 MHz FM signal with a 19 KHz reference signal in the composite baseband signals which is also the if signal of the STL receiver 100. The synchronous FM exciter 105, which will be described in detail hereinafter, is similar in construction and operation to the synchronous FM exciter 75 of the re-transmission station 20. In the exemplary embodiment, the output of the synchronous FM exciter 105 is an FM signal having a frequency in the range of 88 MHz–108 MHz.

Connected to the output of the synchronous FM exciter 105 is a suitable booster 115 of the re-transmission station 20, which, in a conventional manner, amplifies the power of the FM signal applied to a re-transmitting or repeater transmitter 120 of the re-transmitting station 25. Thus, the output of the FM signal from the synchronous FM exciter 105 has the power level thereof amplified by the booster 115 to compensate for losses that may occur from the transmission of signals from the originating broadcast station 15 to the re-broadcast station 25 and, perhaps, increase the signal strength of the originating transmitter 15 without causing transmission interference with other booster stations of the network 10. The output signal of the re-transmitter 20, in the preferred embodiment, is in the range of 88 MHz–108 MHz.

In the FM broadcast network 10, the studio STL transmitter 50 is in communication with the originating broadcast station 15, but is isolated from the FM re-broadcast stations 20 and 25 or any succeeding re-broadcast station of the network 10. The FM signal is transmitted successively from one transmitter to the succeeding transmitter in a serial fashion starting with the originating transmitter 45 and proceeding successively or in series in the order of proximity to the originating transmitter 45.

Figure 2:
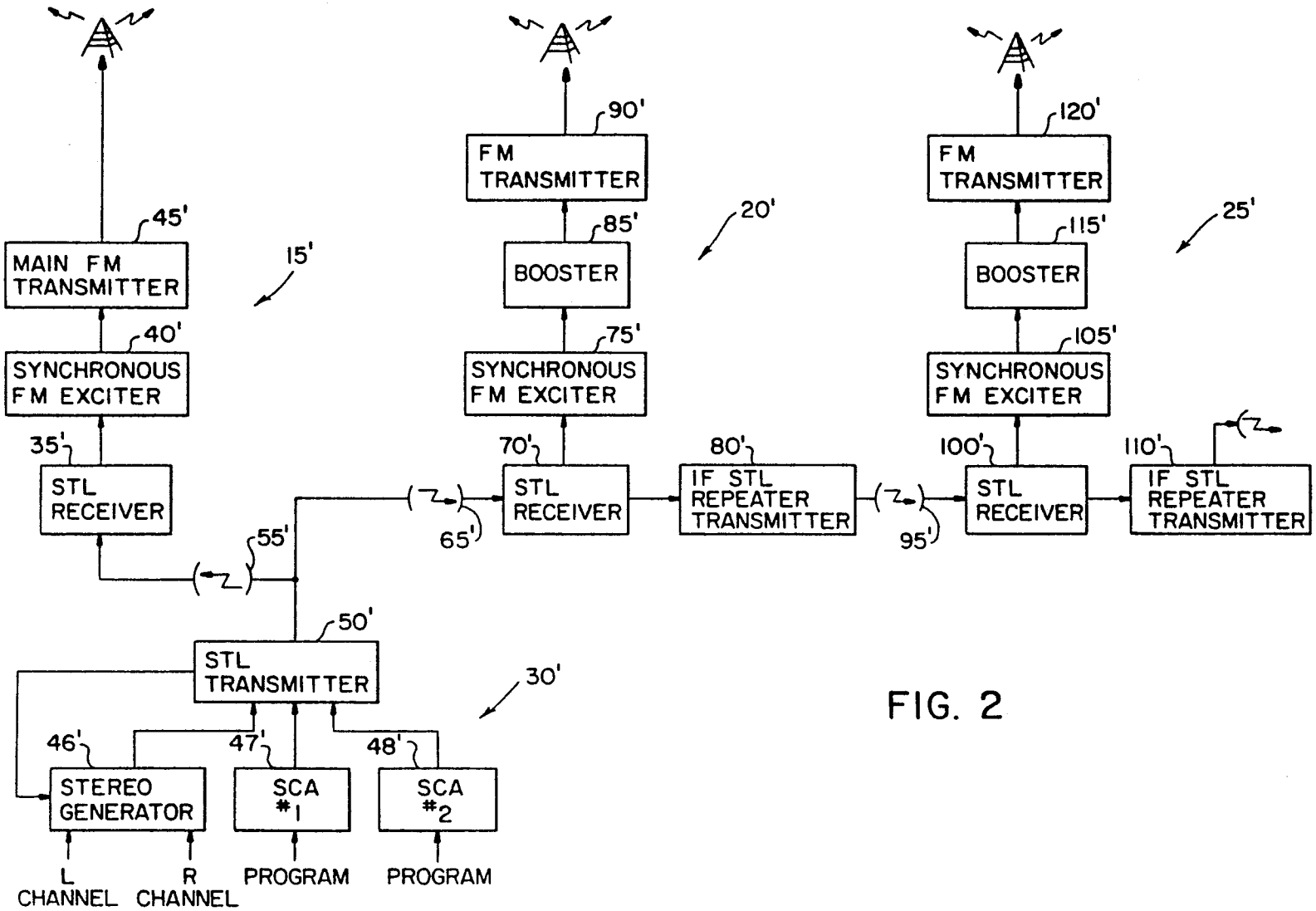
FIG. 2 is a block diagram of a modification of the transmitter system shown in FIG. 1.

Illustrated in FIG. 2 is a parallel feed frequency modulated radio frequency broadcast system or network 125 with boosters, which is a modification of the FM radio frequency broadcast system or network 10 shown in FIG. 1. Elements of the FM radio frequency system 125 similar in construction and operation to the elements of the FM radio frequency system or network 10 are designated with the same reference numeral but with a prime suffix.

The FM radio frequency broadcast system 125 differs from the FM radio frequency broadcast system 10 in that the IF repeater STL transmitter 60 has been omitted. As a consequence thereof, the STL transmitter 50' has the output thereof transmit the baseband composite signals directly to the STL receiver 70' of the re-transmitting broadcast station 20'. Thus, the originating transmitter 5' is boosted by the re-transmitting stations 20', 25' and any succeeding re-transmission station. In this arrangement, the STL transmitter 50' of the studio 30' of the originating broadcast station 10' applies an FM signal to the STL receiver 35' of the originating broadcast station 10' and to the succeeding STL receiver 70' of the re-transmitting broadcast station 20'. Thus, the STL transmitter 50' applies an FM signal to the originating transmitter station 15' and the succeeding re-transmitter and repeater station 20'. The re-transmitting station 25' operates in the manner heretofore described in connection with the re-transmitting station 25 in FIG. 1 and its reception in relation to re-broadcast station 20' is similar to that heretofore described in relation to re-broadcast station 25 and re-broadcast station 20 of FIG. 1.

Figure 3:
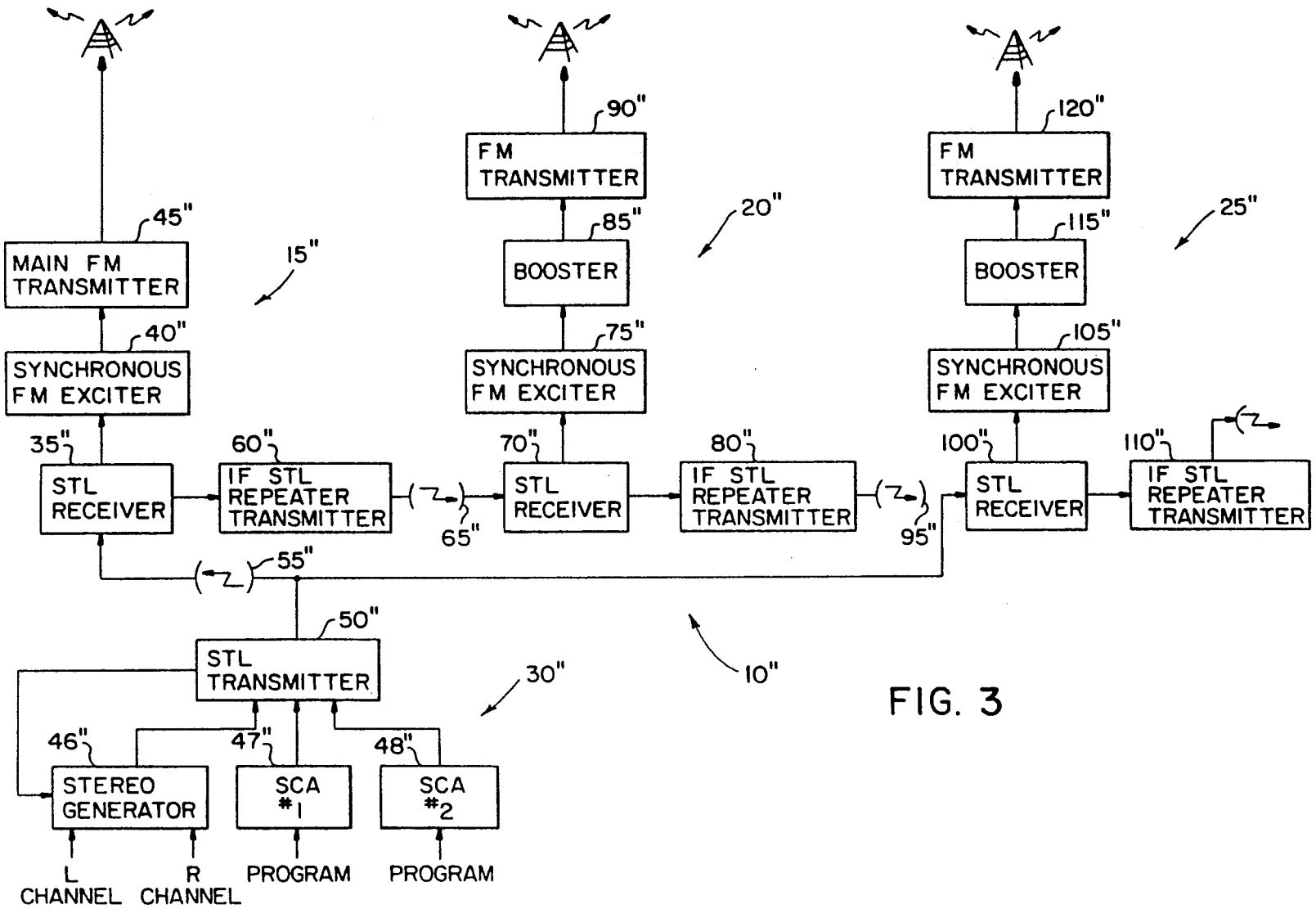
FIG. 3 is a block diagram of a further modification of the transmitter system shown in FIG. 1.

Illustrated in FIG. 3 is a parallel and serial feed FM radio frequency broadcast system or network 130 with boosters, which is a further modification of the FM radio frequency broadcast system 10 shown in FIG. 1. Elements of the FM radio frequency system 130 or network similar in construction and operation to the elements of the radio frequency system 10 are designated with the same reference numeral but with a double prime suffix.

The FM radio frequency broadcast system 130 differs from the FM radio broadcast system 10 in that the STL transmitter 50'' of the studio 30'' for the originating broadcast station 15'' has the output thereof additionally transmit the baseband composite signals to the STL receiver 100'' of the re-transmitting station 25'' through a suitable link 135. Thus, the input of the IF repeating STL receiver 100″ of the re-transmitting station 25″ does not receive the output of the IF repeater STL receiver 70″ of the re-transmitting station 20″ but receives the output of the STL transmitter 50″ of the studio 30″ of the originating broadcast station 15″ through the link 135. The link 135 may be a microwave link, VHF or UHF link, inter-city relays or the like.

The FM broadcast system 130 shown in FIG. 3 is employed when the terrain isolates the FM re-transmitting system 25″ from the FM re-transmitting system 20″. In this arrangement, the STL transmitter 50″ in the studio 30″ sends an FM signal to the originating broadcast station 15″ and to the nearest unobstructed re-transmitting broadcast station 20″ and the originating broadcast station 15″. The FM signal is then relayed to the obstructed re-transmitting broadcast station 25″ from the STL transmitter 50″ at the originating broadcast station 15″.

Figure 4:
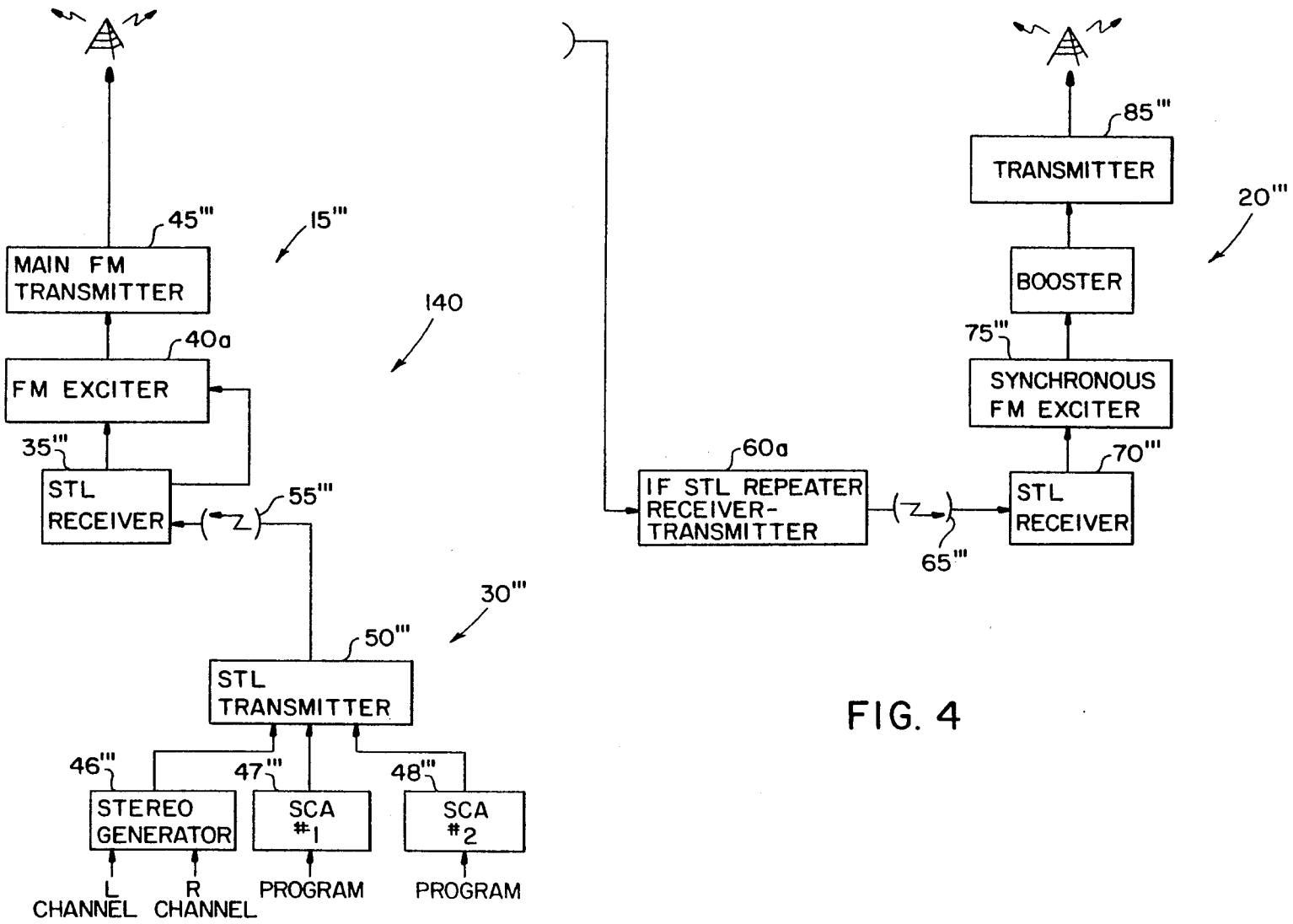
FIG. 4 is a block diagram of a still further modification of the transmitter system shown in FIG. 1.

Illustrated in FIG. 4 is an FM radio frequency broadcast system or network 140 with boosters, which is a still further modification of the FM radio frequency broadcast system or network 10. Elements of the FM radio frequency system or network 140 similar in construction and operation to the elements of the radio frequency system or network 10 are designated with the same reference numeral but with a triple prime suffix.

The FM radio frequency broadcast system or network 140 differs from the FM radio frequency broadcast system or network 10 in that the reference time base signal from the STL receiver 35‴ is applied over a separate path to an FM modulating exciter 40a. An IF repeater STL receiver-transmitter 60a is located at a relay point between the originating transmitter station 15‴ and the booster station 20‴. In the exemplary embodiment, the FM signal received by the IF repeater STL receiver-transmitter 60a from the originating transmitters 45‴ is in the range of 88 MHz–108 MHz. Similarly, the IF signal from the STL receiver 70‴ is applied to the synchronous FM exciter 75‴. The FM exciter 40a is a modification of a conventional FM broadcast exciter and is arranged to accept an external time base reference signal for phase locking the broadcast frequency carrier in the range of 88–108 MHz. The external time base reference signal is in the frequency range of 2.5 KHz to 19 KHz and is generated from a conventional stable crystal oscillator, not shown, having a long term stability of a ppm per year. The time base reference signal for locking the FM broadcast exciter 40a is generated in the STL receiver 35‴.

Figure 5:
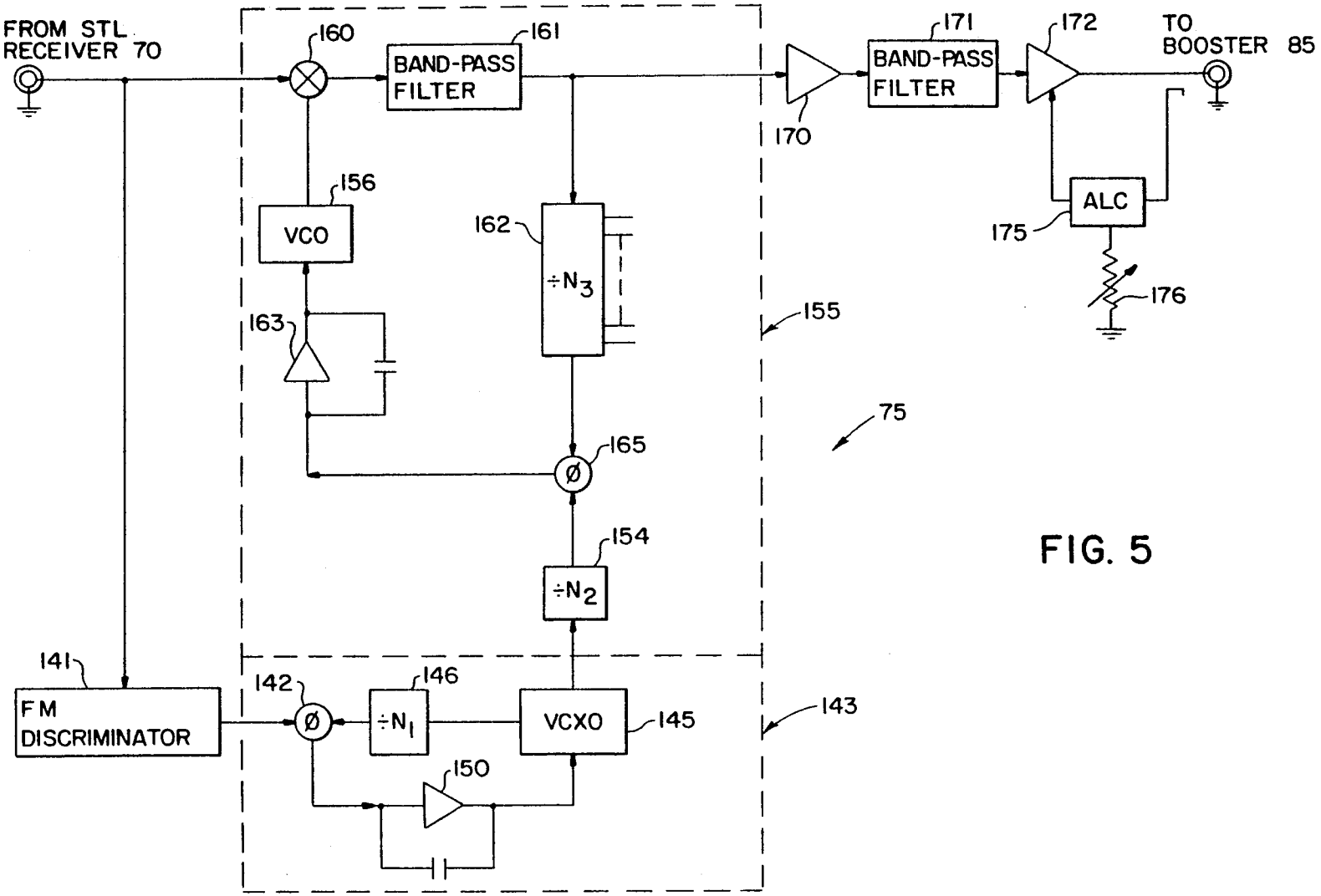
FIG. 5 is a schematic diagram of a synchronous FM exciter employed in the transmitter system shown in FIGS. 1–4.

Illustrated in FIG. 5 is the synchronous FM exciter 75 shown in block diagram in FIG. 1. The synchronous FM exciters 40 and 105 are similar in construction and operation to the synchronous FM exciter 75 and, hence, only the synchronous FM exciter 75 will be described in detail. It follows that the synchronous FM exciters 40′, 75′, 105′, 40″, 75″, 105″, and 75‴ are similar in construction and operation to the synchronous FM exciter 75.

The synchronous FM exciter 75 has applied thereto from the STL receiver 70 an FM signal, which, in the exemplary embodiment, is a 10.7 MHz FM signal modulated by the composite signals for the FM broadcasting including a reference signal of 19 KHz, in the exemplary embodiment. The 10.7 MHz FM signal is applied to a conventional FM discriminator 141, which demodulates the 10.7 MHz signal into the reference signal of 19 KHz. The 19 KHz reference signal is applied to one input of a conventional phase detector of a phase locked loop circuit 143.

A suitable reference signal is generated by a conventional voltage controlled crystal oscillator (VCXO) 145 of the phase locked loop circuit 143. One output of the VCXO 145 is applied to a conventional frequency divider network 146 of the phase locked loop circuit 143. The output of the frequency divider network 146 which is, in the exemplary embodiment, a 19 KHz reference signal, is applied to the other input of the phase detector 142.

The phase detector 142 produces in the output thereof an error signal whose amplitude is proportional to the difference in phase between the input signals applied to the phase detector 142. The phase error signal is applied to a phase error amplifier 150 of the phase locked loop circuit 143. The phase error signal produced in the output of phase error amplifier 150 is applied to the VCXO 145 to compensate for the phase error or difference applied to the inputs of the phase detector 142.

When the phase difference of the reference signal applied to the inputs of the phase detector 142 approaches or approximates zero, the VCXO 145 is phase locked to the 19 KHz reference signal contained in the composite signal in the output of the FM discriminator 141. The stable reference signal in the output of the VCXO 145 is now phase locked with the reference signal of the composite signal in the output of the FM discriminator 141 and the IF frequency modulated signal sent by the originating broadcast station 15.

The output of the VCXO 145 is applied to a conventional frequency divider network 154 of a phase locked loop circuit 155. The reference signal in the output of the frequency divider network 154, in the exemplary embodiment, is 10 KHz. The 10 KHz reference signal of the divider network 154 is applied to one input of a conventional phase detector 165 of a phase locked loop circuit 155.

A conventional voltage controlled oscillator (VCO) 156 of the phase locked loop circuit 155 applies a frequency to one input of a conventional mixer circuit 160. In the exemplary embodiment, the output frequency of the VCO 156, in the range of 77.3 MHz–97.3 MHz, is the difference between the input frequency from the STL receiver 70 and the broadcast frequency of the re-transmitting transmitter 90. Applied to another input of the mixer circuit 160 is the intermediate frequency FM signal from the STL receiver 70. In the exemplary embodiment, the intermediate frequency FM signal of the STL receiver 70 is a 10.7 MHz FM signal. The mixer circuit 160 combines by adding the output signal from the VCO 156 and the output signal from the STL receiver 70 and produces in the output thereof the FM broadcast frequency signal in the range of 88 MHz–108 MHz.

Connected to the output of the mixer circuit 160 is a suitable band-pass filter 161, which passes FM signals in the frequency range of 88 MHz–108 MHz. The output of the band-pass filter 161 is applied to a conventional frequency divider 162 of the phase locked loop circuit 155.

The frequency divider 162 produces in its output a 10 KHz signal, which is applied to one input of a phase detector 165 of the phase locked loop circuit 155. The output of the frequency divider 154, which, in the exemplary embodiment, is 10 KHz, is applied to the other input of the phase detector 165. The 10 KHz output signal from the frequency divider 154 is a reference signal. The 10 KHz output signal from the frequency divider 162 is a comparison signal.

The phase detector 165 produces in the output thereof an error signal whose amplitude is proportional to the difference in phase between the input signals applied to the phase detector 165. The phase error signal is applied to a phase error amplifier 163 of the phase locked loop circuit 155. The phase error signal produced in the output of the phase error amplifier 163 is applied to the VCO 156 to compensate for the phase error or differences of the signals applied to the inputs of the phase detector 165.

When the phase differences of the reference and comparison signals applied to the inputs of the phase detector 165 approximate or approach zero, the sum of the frequency of the VCO 156 and the incoming IF signal, in the exemplary embodiment, of 10.7 MHz, is phase locked to the 10 KHz reference signal in the output of the frequency divider 162 and is derived from the broadcast frequency by programming the programmable divider 162 in a well-known manner. The stable reference signal in the output of the VCXO 145 is now phase locked with the reference signal sampled from the output of the band-pass filter 161, which passes the range of broadcast frequencies. The FM broadcast signals in the output of the band-pass filter 161 have been stabilized in frequency and phase as well as modulation level with the IF frequency modulated signals sent by the originating broadcast station 15.

The phase locked loop circuits 143 and 155 serve to maintain modulation and frequency integrity for the re-transmission station 20. The stations 15, 20 and 25 are synchronized to eliminate interference. Heterodyne and noise to the unsynchronized transmitters, phase shifts on the baseband, group delays and inconsistent modulation levels have been obviated to enhance broadcast program quality.

The FM broadcast output signals of the band-pass filter 161 are applied to a suitable power amplifier 170, which amplifies the power level of the FM broadcast output signals of the band-pass filter 161. Connected to the output of the power amplifier 170 is a suitable band-pass filter 171, which passes FM broadcast signals in the range of 88 MHz to 108 MHz. A suitable power amplifer 172 is connected to the band-pass filter 171 and its FM broadcast output signal is applied to the booster 85. The FM broadcast output signal of the booster 85 is applied to the re-transmitter 90 for broadcasting the FM signal that has originated from the broadcast studio 30.

A conventional automatic level control (ALC) circuit 175 is coupled to the output of the power amplifier 172 and applies a compensating control voltage to the power amplifier 172 to automatically maintain power output level applied to the booster 85. Included in the ALC circuit 175 is an adjustable variable resistor 176 for setting a reference voltage applied to the level control circuiting of power amplifier 172 in a well-known manner.

While reference herein may be made to standard FM broadcast frequency signals, it appears that the invention disclosed herein is also applicable to any FM radio frequency signals, including VHF, UHF and microwave signals, FM inter-city relay link signals, and any FM broadcast signals. It is also apparent that the synchronous FM exciters for the originating broadcast stations 15, 15', and 15'' need not employ all the operational features of the synchronous FM exciter 75, which were described in detail.

Figure 6:
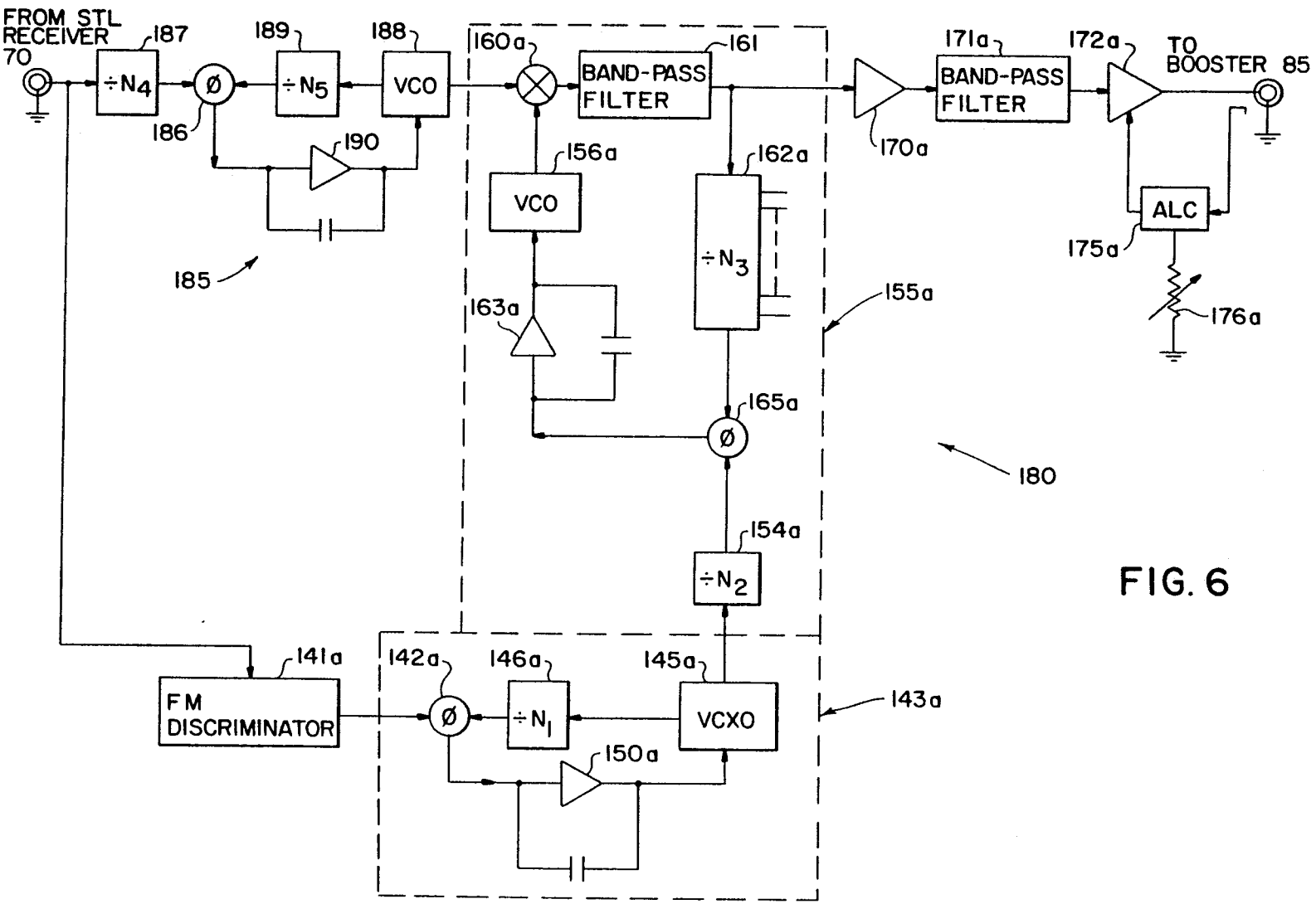
FIG. 6 is a schematic diagram of a synchronous FM exciter, which is a modification of the synchronous FM exciter shown in FIG. 5.

Illustrated in FIG. 6 is a synchronous FM exciter 180, which is a modification of the synchronous FM exciter 75 shown in FIG. 5. Components of the synchronous FM exciter 180 similar in construction and operation to the components of the synchronous FM exciter 75 have been designated with the same reference numerals but with a suffix "a".

The synchronous FM exciter 180 differs from the synchronous FM exciter 75 to the extent that a phase locked loop circuit 185 is interposed between the STL receiver 70 with the mixer 160a. The phase locked loop circuit 185 includes a phase detector 186. The STL receiver 70 applies the FM intermediate frequency modulated signal having a modulation level of $\Delta f_1$ in the output thereof to a suitable frequency divider circuit 187 of the phase locked loop circuit 185. The output of the frequency divider circuit 187 having a dividing ratio of $N_4$ is applied to one input of the phase detector 186. In the exemplary embodiment, the output of the frequency divider circuit 187 is an FM 5.35 MHz signal having a modulation level of $\frac{1}{2} \Delta f_1$, since $N_4$ is chosen to be 2.

Also included in the phase locked loop circuit 185 is a suitable voltage controlled oscillator 188, which applies a stable comparison signal to another input of the phase detector 186 through a suitable frequency divider circuit 189 having a dividing ratio of $N_5$. In the exemplary embodiment, the output of VCO 188 is 16.05 MHz and the stable comparison signal applied to the phase detector 186 is a 5.35 MHz having a modulation level of $3/2\ \Delta f_1$, since $N_5$ is chosen to be 3. The phase detector 186 compares the phase of the signals applied to the inputs thereof. If there is a phase difference therebetween, the error or difference therebetween produces a voltage amplitude in the output of the phase detector 186 commensurate with such error or difference. The phase difference signal produced in the output of the phase detector 186 is applied to an error correction amplifier 190. The output of the error correction amplifier 190 is applied to the voltage controlled oscillator 188 to correct the phase error between the signals applied to the inputs of the phase detector 186.

When the phase error or phase difference between the signals to the input of the phase detector 186 approaches or is approximately zero, the frequency and the modulation characteristics of the VCO 188 may be calculated in the following manner:

$$\frac{\text{VCO frequency}}{N_5} = \frac{\text{IF frequency}}{N_4} \tag{1}$$

or $$\text{VCO frequency} = \frac{N_5}{N_4}\ \text{IF frequency}$$

$$\text{VCO modulation} = \frac{N_5}{N_4}\ \text{IF modulation} \tag{2}$$

In this manner, the modulation level of an incoming FM carrier can be modified to a level of modulation acceptable to the succeeding STL receiver. The level of modulation of an FM signal applied to a transmitter for re-transmission can be synchronized and stabilized with the level of modulation of an FM radio frequency signal transmitted at an originating transmitter, when the FM intermediate frequency signal is modified to a level of modulation acceptable to the succeeding STL receiver.

What is claimed is:

1. A synchronous frequency modulated booster system for re-transmitting a frequency modulated broadcast signal comprising:

A. transmitting means for re-transmitting a frequency modulated broadcast signal;

*B.* receiving means for receiving *a frequency modulated broadcast signal and* a frequency modulated intermediate frequency signal; and C. a synchronous frequency modulated exciter receiving said frequency modulated intermediate frequency signal from said receiving means and applying to said transmitting means [a] *said* frequency modulated broadcast signal for re-transmission by said transmitter means, D. said synchronous frequency modulated exciter comprising:

(a) a first phase locked loop circuit for phase locking said frequency modulated intermediate frequency signal with a first stable reference signal, said first phase locked loop circuit comprising a stable frequency source from which said first stable reference signal is derived, and (b) a second phase locked loop circuit for phase locking said frequency modulated broadcast signal with a second stable reference signal derived from said stable frequency source to synchronize said frequency modulated broadcast signal with said second stable reference signal, thereby synchronizing said frequency modulated broadcast signal with said frequency modulated intermediate frequency signal.

2. A synchronous frequency modulated booster system as claimed in claim 1, said synchronous frequency modulated exciter further comprising:

(a) a mixer circuit for said second phase locked loop circuit having a plurality of inputs and an output, said frequency modulated intermediate frequency signal being applied to one input of said mixer circuit, and (b) a voltage controlled oscillator for said second phase locked loop circuit generating a signal for application to another input of said mixer circuit, said mixer circuit combining the signals applied to the inputs thereof for producing in the output thereof the frequency modulated broadcast signal, (c) said second phase locked loop circuit producing a phase error correction signal for application to said voltage controlled oscillator for said second phase locked loop circuit in response to phase [difference] *differences* between said second stable reference signal and a comparison signal derived from said frequency modulated broadcast signal for phase locking said frequency modulated broadcast signal with said second stable reference signal to stabilize the frequency modulated broadcast signal applied to said transmitting means with said frequency modulated intermediate frequency signal [bent] *sent* by said receiving means.

3. A synchronous frequency modulated booster system as claimed in claim 2 wherein said frequency modulated intermediate frequency signal includes an intermediate frequency reference signal and wherein said stable frequency source is a voltage controlled oscillator and wherein said synchronous frequency modulated exciter further comprising:

(a) a phase detector for said first phase locked loop circuit having a plurality of inputs and an output, (b) a discriminator circuit receiving said frequency modulated intermediate frequency signal from said receiving means for applying said intermediate frequency reference signal to one input of said phase detector for said first phase locked loop circuit, (c) means including said voltage controlled oscillator for said first phase locked loop circuit for applying said first stable reference signal to said phase detector for said first phase locked loop circuit, and (d) means connected to said output of said phase detector for said first phase locked loop circuit for applying from the output of said phase detector of said first phase locked loop circuit a [phae] *phase* error correction signal to said voltage controlled oscillator for said first phase locked loop circuit for phase locking said first stable reference signal applied by said means including said voltage controlled oscillator for said first phase locked loop circuit with said intermediate frequency reference signal to synchronize transmitting frequencies and modulated depth of said frequency modulated broadcast signal with said frequency modulated intermediate frequency sent by said receiving means.

4. A synchronous frequency modulated booster system as claimed in claim 3 wherein said synchronous frequency modulated exciter further comprising:

(a) a phase detector for said second phase locked loop circuit having a plurality of inputs and an output, (b) means for said second phase locked loop circuit connecting said voltage controlled oscillator for said first phase locked loop circuit with one input of said phase detector for said second phase locked loop circuit for applying said second stable reference signal thereto, (c) means for said second phase locked loop circuit applying a comparison signal derived from said frequency modulated broadcast signal to another input of said phase detector for said second phase locked loop circuit, and (d) means for said second phase locked loop circuit connected to the output of said phase detector for said second phase locked loop circuit and said voltage controlled oscillator for said second phase locked loop circuit to apply said phase error correction signal of said second phase locked loop circuit to said voltage controlled oscillator for said second phase locked loop circuit for phase locking said frequency modulated broadcast signal with said second stable reference signal to stabilize said frequency modulated broadcast signal applied to said transmitting means with the frequency modulated intermediate frequency signal received by said receiving means.

5. A synchronous frequency modulated booster system as claimed in claim 3 wherein the reference signal included in said frequency modulated intermediate frequency signal is within composite baseband signals.

6. A frequency modulated broadcast network comprising:

A. a first broadcast station originating a frequency modulated broadcast signal, said first broadcast station comprising means for transmitting a frequency modulated intermediate frequency signal with a reference signal; and B. a second broadcast station for re-transmitting said frequency modulated broadcast signal, said second broadcast station comprising a synchronous frequency modulated booster system for re-transmitting said frequency modulated broadcast signal, said synchronous frequency modulated booster system comprising:

(a) transmitting means for re-transmitting said frequency modulated broadcast signal, (b) receiving means for receiving said frequency modulated intermediate frequency signal *and said frequency modulated broadcast signal*, and (c) a synchronous frequency modulated exciter receiving said frequency modulated intermediate frequency signal from said receiving means and applying to said transmitting means [a] *said* frequency modulated broadcast signal for re-transmission by said transmitting means, (d) said synchronous frequency modulated exciter comprising:

1. a first phase locked loop circuit for phase locking said frequency modulated intermediate frequency with a first stable reference signal, said first phase locked loop circuit comprising a stable frequency source from which said first stable reference signal is derived, and
2. a second phase locked loop circuit for phase locking said frequency modulated broadcast signal with a second said stable reference signal derived from said stable frequency source to synchronize said frequency modulated broadcast signal with said frequency modulated intermediate frequency signal.

7. A frequency modulated broadcast network as claimed in claim 6 wherein said synchronous frequency modulated exciter further comprising:

1. a mixer circuit for said second phase locked loop circuit having a plurality of inputs and an output, said frequency modulated intermediate frequency signal being applied to one input of said mixer circuit,
2. a voltage controlled oscillator means for said second phase locked loop circuit generating a signal for application to another input of said mixer circuit, said mixer circuit combining the signals applied to the inputs thereof for producing in the output thereof the frequency modulated broadcast signal,
3. said second phase locked loop circuit producing a phase error correction signal for application to said voltage controlled oscillator for said second [phae] *phase* locked loop circuit in response to phase differences between said second stable reference signal and a comparison signal derived from said frequency modulated broadcast signal for phase locking said frequency modulated broadcast signal with said second stable reference signal to stabilize the frequency modulated broadcast signal applied to said transmitter means with said frequency modulated intermediate frequency signal sent by said receiving means.

8. A frequency modulated broadcast network as claimed in claim 7 wherein said stable frequency source is a voltage controlled oscillator and wherein said synchronous frequency modulated exciter further comprising:

1. a phase detector for said first phase locked loop circuit having a plurality of inputs and an output,
2, a discriminator circuit receiving said frequency modulated intermediate frequency signal from said receiving means for applying said intermediate frequency reference signal to one input of said phase detector of said first phase locked loop circuit,
3. means including said voltage controlled oscillator for said first phase locked loop circuit for applying said first stable reference signal to said phase detector for said first phase locked loop circuit, and
4. means connected to said output of said phase detector for said first phase locked loop circuit for applying from the output of said phase detector of said first phase locked loop circuit a [phae] *phase* error correction signal to said voltage controlled oscillator for said first phase locked loop circuit for phase locking said first stable reference signal applied by said means including said voltage controlled oscillator for said first phase locked loop circuit with said intermediate frequency reference signal to synchronize said frequency modulated broadcast signal with said frequency modulated intermediate frequency signal sent by said receiving means.

9. A frequency modulated broadcast network as claimed in claim 8 wherein said synchronous frequency modulated exciter further comprising:

(a) a phase detector for said second phase locked loop circuit having a plurality of inputs and an output, (b) means for said second phase locked loop circuit connecting said voltage controlled oscillator for said first [phae] *phase* locked loop circuit with one input of said phase detector for said second phase locked loop circuit for applying said second stable reference signal thereto, (c) means for said second [phae] *phase* locked loop circuit applying a [comprising] *comparison* signal derived from said frequency modulated broadcast signal to another input of said phase detector for said second phase locked loop circuit, and (d) means for said second phase locked loop circuit connected to the output of said [phae] *phase* detector for said second phase locked loop circuit and said voltage controlled oscillator for said second phase locked loop circuit to apply said phase error correction signal of said second phase locked loop circuit to said voltage controlled oscillator for said second phase locked loop circuit for phase locking said frequency modulated broadcast signal with said second stable reference signal to stabilize said frequency modulated broadcast signal applied to said transmitting means with the frequency modulated intermediate frequency signal received by said receiving means.

10. A frequency modulated broadcast network as claimed in claim 6 wherein said means of said first broadcast station includes a receiver with an output providing a frequency modulated intermediate frequency signal, and an intermediate frequency transmitter for sending said frequency modulated intermediate frequency signal received from said receiver, said frequency modulated intermediate frequency signal sent by said intermediate frequency transmitter being received by said receiving means of said second broadcast station.

11. A frequency modulated broadcast network as claimed in claim 10 and comprising:

A. a third broadcast station for re-transmitting said frequency modulated broadcast signal, said third broadcast station comprising a synchronous frequency modulated booster system for re-transmitting said frequency modulated broadcast signal, said synchronous frequency modulated booster system for said third broadcast station comprising:

(a) transmitting means for re-transmitting said frequency modulated broadcast signal, (b) receiving means for receiving said frequency modulated intermediate frequency signal from said receiver of said first broadcast station, (c) a synchronous frequency modulated exciter receiving said frequency modulated intermediate frequency signal from said receiving means of said third broadcast station and applying to said transmitting means of said third broadcast station the frequency modulated broadcast signal for re-transmission by said transmitting means for said third broadcast station, (d) said synchronous frequency modulated exciter for said third broadcast station comprising:

1. a first phase locked loop circuit for phase locking said frequency modulated intermediate frequency signal with a first stable reference signal, said first phase locked loop circuit comprising a stable frequency source from which said first reference signal is derived and 2. a second phase locked loop circuit for phase locking said frequency modulated broadcast signal with a second stable reference signal derived from said stable frequency source to synchronize said frequency modulated broadcast signal with said frequency modulated intermediate frequency signal.

12. A frequency modulated broadcast network as claimed in claim 10 wherein said second broadcast station includes a synchronous frequency modulated transmitter for sending said frequency modulated intermediate frequency signal received from said receiver of said second broadcast signal [received from said receiver of said second broadcast station] and comprising;

A. a third broadcast station for re-transmitting said frequency modulated broadcast signal, said third broadcast station comprising a synchronous frequency modulated booster system for re-transmitting said frequency modulated broadcast signal, said synchronous frequency modulated booster system for said third broadcast station comprising:

(a) transmitting means for re-transmitting said frequency modulated broadcast signal, (b) receiving means for receiving said frequency modulated signal from said intermediate frequency transmitter of said second broadcast station, and (c) a synchronous frequency modulated exciter receiving said frequency modulated intermediate frequency signal from said receiving means of said third broadcast station and applying to said transmitting means of said third broadcast station the frequency modulated broadcast signal for re-transmission by said transmitting means of said third broadcast station, (d) said synchronous frequency modulated exciter for said third broadcast station comprising:

1. a first phase locked loop circuit for phase locking said frequency modulated intermediate frequency signal with a first stable reference signal, said first phase locked loop circuit comprising a stable reference source from which said first stable reference signal is derived, and 2. a second phase locked loop circuit for phase locking said frequency modulated broadcast signal with a second stable reference signal derived from said stable frequency source to synchronize said frequency modulated broadcast signal with said frequency modulated intermediate frequency signal.

13. A frequency modulated broadcast network as claimed in claim 6 wherein the reference signal included in the frequency modulated intermediate frequency signal of said first broadcast station is within composite baseband signals.

14. A synchronous frequency modulated booster system for re-transmitting a frequency modulated broadcast signal comprising:

a. transmitting means for re-transmitting a frequency modulated broadcast signal;

b. receiving means for receiving a *frequency modulated broadcast signal and a* frequency modulated intermediate frequency signal *modulated with a reference signal*; and c. a synchronous frequency modulated exciter receiving said *frequency modulated broadcast signal and said* frequency modulated intermediate frequency signal from said receiving means and applying to said transmitting means [a] *said* frequency modulated broadcast signal *received from said receiving means* for re-transmission by said transmitting means, said synchronous frequency modulated exciter *employing said reference signal for* synchronizing said frequency modulated broadcast signal *received from said receiving means* with said frequency modulated intermediate frequency signal.

15. A synchronous frequency modulated booster system as claimed in claim 14 wherein the intermediate frequency signal received by said receiving means for application to said synchronous frequency modulated exciter includes [a] *said* reference signal within composite baseband signals.

16. A synchronous frequency modulated booster system for re-transmitting a frequency modulated broadcast signal as claimed in claim 15 and comprising a phase locked loop circuit interconnecting said receiving means and said transmitting means via said synchronous frequency modulated exciter for modifying the level of modulation of the frequency modulated intermediate frequency signal to an acceptable level of modulation.

17. A frequency modulated broadcast network comprising:

A. a first broadcast station originating a frequency modulated broadcast signal, said first broadcast station comprising means for transmitting a frequency modulated intermediate frequency signal with a reference signal; and B. a second broadcast station for re-transmitting said frequency modulated broadcast signal, said second broadcast station comprising a synchronous frequency modulated booster for re-transmitting said frequency modulated broadcast system signal, said synchronous frequency modulated booster system comprising:

(a) transmitting means for re-transmitting said frequency modulated broadcast signal, (b) receiving means for receiving said *frequency modulated broadcast signal and said* frequency modulated intermediate frequency signal, and (c) a synchronous frequency modulated exciter receiving said *frequency modulated broadcast signal and said* frequency modulated intermediate frequency signal from said receiving means and applying to said transmitting means [a] *said* frequency modulated broadcast signal for re-transmission by said transmitting means, said synchronous frequency modulated exciter *employing said reference signal for* synchronizing said frequency modulated broadcast signal with said frequency modulated intermediate frequency signal.

18. A frequency modulated broadcast network as claimed in claim 17 wherein said second broadcast station is serially fed from said first broadcast station.

19. A frequency modulated broadcast network as claimed in claim 17 wherein said second broadcast station is parallel fed from said first broadcast station.

20. A frequency modulated broadcast network as claimed in claim 17 wherein said second broadcast station is serially fed from said first broadcast station, said frequency modulated broadcast network comprising a third broadcast station parallel fed from said first broadcast station for re-transmitting said frequency modulated broadcast signal, said third broadcast station comprising a synchronous frequency modulated booster system for re-transmitting said frequency modulated broadcast signal, said synchronous frequency modulated booster system for said third broadcast station comprising:

(a) [tramsmitting] *transmitting* means for re-transmitting said frequency modulated broadcast signal, (b) receiving means for receiving said *frequency modulated broadcast signal and said* frequency *modulated* intermediate frequency signal, and (c) a synchronous frequency modulated exciter receiving said frequency modulated intermediate frequency signal from said receiving means for said third broadcast station and applying to said transmitting means for said third broadcast station [a] *said* frequency modulated broadcast signal for re-transmission by said transmitting means of said third broadcast station.

21. A frequency modulated broadcast network as claimed in claim 17 and comprising studio means for transmitting to said means of said first broadcast station said frequency modulated intermediate frequency signal and said reference signal.

22. A frequency modulated broadcast network as claimed in claim 17 and comprising studio means for transmitting to said means of said first broadcast station said frequency modulated intermediate frequency signal, said reference signal and a composite baseband signal of program signals.

23. A frequency modulated broadcast network as claimed in claim 17 and comprising studio means for transmitting to said means of said first broadcast station said frequency modulated intermediate frequency signal and said reference signal, said reference signal being an unmodulated signal.

24. A frequency modulated broadcast network as claimed in claim 17 wherein said first broadcast station includes a synchronous frequency modulated exciter receiving said frequency modulated intermediate frequency signal from said means of said first broadcast station for synchronizing said frequency modulated broadcast signal with said reference signal of said frequency modulated intermediate frequency signal.

25. A frequency modulated broadcast network as claimed in claim 17 wherein said synchronous frequency modulated exciter includes means for phase locking said frequency modulated broadcast signal of said second broadcast station to said reference signal.

26. A frequency modulated broadcast network as claimed in claim 21 wherein said studio means includes a frequency stable oscillator for generating said reference signal.

27. A frequency modulated broadcast network as claimed in claim 17 wherein said first broadcast station further comprising an intermediate frequency repeater transmitter connected to said means of said first broadcast station for transmitting to said receiving means of said second broadcast station said frequency modulated intermediate frequency signal and said reference signal.

28. A frequency modulated broadcast network as claimed in claim 27 and comprising studio means for transmitting to said means of said first broadcast station said frequency modulated intermediate frequency signal with said reference signal and program signals.

29. A frequency modulated broadcast network as claimed in claim 17 and comprising studio means having an intermediate frequency repeater transmitter for transmitting to said means of said first broadcast station and receiving means of said second broadcast station said frequency modulated intermediate frequency signal and said reference signal.

30. A frequency modulated broadcast network as claimed in claim 29 wherein said studio means transmits along with said frequency modulated intermediate frequency signal said reference signal and said program signals.

* * * * *